United States Patent
Peng et al.

(10) Patent No.: US 7,426,682 B2
(45) Date of Patent: Sep. 16, 2008

(54) METHOD OF GENERATING ERROR DETECTION CODES

(75) Inventors: Chiung-Ying Peng, Taipei (TW); Ching-Yu Chen, Taipei (TW)

(73) Assignee: Via Technologies, Inc., Taipei (TW)

( * ) Notice: Subject to any disclaimer, the term of this patent is extended or adjusted under 35 U.S.C. 154(b) by 736 days.

(21) Appl. No.: 10/797,007

(22) Filed: Mar. 11, 2004

(65) Prior Publication Data

US 2004/0181736 A1   Sep. 16, 2004

Related U.S. Application Data

(60) Provisional application No. 60/453,194, filed on Mar. 11, 2003.

(51) Int. Cl.
G06F 11/00 (2006.01)
G08C 25/00 (2006.01)
H03M 13/00 (2006.01)
H04L 1/00 (2006.01)

(52) U.S. Cl. .................. 714/799; 714/758

(58) Field of Classification Search ............ 714/768, 714/770, 771, 805, 758, 799
See application file for complete search history.

(56) References Cited

U.S. PATENT DOCUMENTS

| | | | |
|---|---|---|---|
| 4,216,540 A * | 8/1980 | McSpadden ............ 714/774 |
| 5,003,539 A * | 3/1991 | Takemoto et al. ........... 714/785 |
| 5,633,635 A * | 5/1997 | Ohishi et al. ............... 341/94 |
| 5,745,508 A * | 4/1998 | Prohofsky ................. 714/766 |
| 5,903,532 A * | 5/1999 | Ikeda ..................... 369/59.25 |
| 5,935,268 A * | 8/1999 | Weaver .................... 714/758 |
| 5,991,501 A * | 11/1999 | Higurashi et al. ............ 386/98 |
| 6,170,073 B1 * | 1/2001 | Jarvinen et al. ............. 714/758 |
| 6,175,686 B1 * | 1/2001 | Noda ....................... 386/123 |
| 6,662,335 B1 * | 12/2003 | Huang ...................... 714/769 |
| 7,139,962 B2 * | 11/2006 | Lin et al. ................... 714/758 |
| 2001/0042230 A1 * | 11/2001 | Williams et al. ............ 714/703 |
| 2003/0103480 A1 * | 6/2003 | You et al. ................... 370/335 |
| 2003/0161239 A1 * | 8/2003 | Yamawaki ................. 369/59.25 |
| 2003/0218816 A1 * | 11/2003 | Katoh et al. ................. 360/53 |
| 2004/0103360 A1 * | 5/2004 | Mori et al. .................. 714/768 |

* cited by examiner

*Primary Examiner*—Mujtaba Chaudry
(74) *Attorney, Agent, or Firm*—Rabin & Berdo, PC

(57) ABSTRACT

A method for generating error detection code is disclosed. Firstly, a first error detection code PEDC is derived by using 12-byte unknown sector data information including ID, IED, RSV and the 2048-byte main data while the main data is delivered from a host. Secondly, a second error detection code MEDC is obtained by using known 12-byte sector data information including ID, IED, RSV and the 2048-byte main data. Thereafter, the real error detection code EDC is obtained by applying an exclusive-OR operation to both the PEDC and MEDC.

17 Claims, 5 Drawing Sheets

METHOD OF GENERATING ERROR DETECTION CODES

REFERENCE TO PROVISIONAL APPLICATION

This application claims priority under 35 USC §119 (e) of applicants' now abandoned provisional application Ser. No. 60/453,194, filed Mar. 11, 2003.

BACKGROUND OF THE INVENTION

1. Field of the Invention

The present invention relates in general to a method of generating error detection codes. In particular, the present invention relates to a method of generating error detection codes for a DVD encoder.

2. Description of the Related Art

Formatting of data onto an optical disc and an error correcting process thereof are explained in FIGS. 1, 2 and 3. The error correcting process for a DVD and an ECC block are explained in FIGS. 1 and 2.

As shown in FIG. 1, information recorded on a DVD has a physical structure including a plurality of data sectors. One data sector 20 comprises, in order from the head position thereof, Identification Data (ID) 21 of a start position of the data sector 20, ID Error Detection Code (IED) 22 correcting errors of ID 21, reserve data (RSV) 23, main data 24 (i.e. the constituent data to be recorded), and an error detection code (EDC) 25 for detecting errors of ID 21, IED 22, RSV 23, and main data 24. A plurality of data sectors are arranged in sequence to constitute recording data.

Next, a process in an encoder described subsequently for creating an ECC block 30 by a plurality of data sectors is explained in FIG. 2. As shown, an ECC block including 16 data sectors is illustrated in FIG. 2. To meet the ECC format requirement, each data sector 20 are arranged to include ID 21, IED 22, RSV 23, main data 24, and EDC, while each data sector (having 2064 bytes) is further arranged in an array of 12 data rows (each containing 172 bytes). The first data row should start with three fields: ID, IED, and RSV, followed by 160-byte main data. The next 10 data rows should each contain 172-byte main data, and the last data row should contain 168-byte main data followed by a 4-byte EDC.

For each data row, a 10-byte ECC inner-code Parity (PI) 31 is generated and attached to the end of corresponding data row to constitute one correction block 34 as shown on the right side of FIG. 2. At this stage, correction blocks 34 with PI 31 attached are arranged in 12 rows along with the y-axis orientation. After that, the process is repeated with respect to 16 data sectors (for an ECC block). Accordingly, correction blocks 34 of 192 (=12×16) rows are obtained.

Thereafter, 16 ECC outer-code parities (PO) 32 are respectively generated and attached to each corresponding data columns. It is noted that PO 32 is also attached to a portion of PI 31 within the correction block 34 as shown in FIG. 2.

From the above-mentioned process, one ECC block 30 including 16 data sectors is produced as shown in the right side of FIG. 2. At this time, the total amount of information included within one ECC block 30 is expressed by:

(172+10)bytes×(192+16)lines=37856 bytes

The main data 24 (i.e., other than the parity codes and sector data information ID 21, IED 22, RSV 23) therein is expressed by:

2048 bytes×16=32768 bytes

An ECC block 30 shown in FIG. 2 is formed by arranging 16 data sectors in an array of 192 rows of 172 bytes each. Furthermore, a 10-byte PI is appended to each one of the 192 rows, and each one of the 182 columns includes a 16-byte PO. Thus a complete ECC block has 208 rows of 208 bytes each. Please note that the bytes of this array shown in FIG. 2 are identified as $B_{i,j}$, where the indexes i and j indicate the row number and the column number, respectively. For example, $B_{1,0}$ indicates the byte at row 1 and column 0, and $B_{190,170}$ indicates the byte at row 190 and column 170. Accordingly, PI 31 encompasses those bytes $B_{i,j}$ identified by i=0 to 207 and j=172 to 181, while PO 32 includes the bytes $B_{i,j}$ identified by i=192 to 207 and j=0 to 171.

ECC block 30 comprises both PI 31 and PO 32 as shown in the right side of FIG. 2 such that data arranged along an x-axis orientation in FIG. 2 can be corrected by PI 31 and the data arranged along the y-axis orientation can be corrected by PO 32. It is thus possible to perform error correction along both axes within the ECC block 30 shown in FIG. 2.

More concretely, if a certain correction block 34 aforementioned (each having 182 bytes in total including PI 31) is entirely destroyed by physical damage (such as by scratches), because only one byte data is lost with respect to PO 32 as viewed along the y-axis orientation, it is possible to accurately recover this byte from damage by means of error correction procedure based PO 32.

The manner of actually recording the data sectors 20 included in the ECC blocks 30 is explained in FIG. 3, wherein the bytes indicated as $B_{i,j}$ corresponds to the data shown on the right side of FIG. 2. Processes at the time of recording the data sector 20 in FIG. 3 (i.e. an interleaving process and an 8-to-16 modulation process) are performed by the encoder, and are described subsequently.

When recording the ECC blocks 30 to the disk, the plurality data rows of the ECC block 30 are firstly aligned along the x-axis orientation for each correction block 34 as shown in the top stage of FIG. 3. An interleaving procedure is then performed for division into 16 recording sectors 40 (as shown in a second top stage in FIG. 3). At this time, one recording sector 40 includes 2366 bytes (=37856 bytes/16), with a data sector 20, PI 31 and PO 32 are intermingled and included in each recording sector 40. ID 21 (refer to FIG. 1) in the data sector 20, however, positions a head portion of each recording sector 40.

The recording sector 40 is divided into a plurality of segments 41 each comprising data and having 91 bytes, with a header H appended to each (as shown in a third top stage in FIG. 3). Then, one sync frame 42 is produced from one segment 41 via a 8-to-16 modulation of the recording sector 40 including the paired headers H and segments 41. At this time, one sync frame 42 is composed of a header H' and segment 43 (as shown in a bottom stage of FIG. 3). Further, data size in one sync frame 42 is expressed by:

91 bytes×8×(16/8)=1456 bytes

Data is then written to a disc in continuous sync frames 42. At this time, one recording sector 40 includes 26 sync frames 42.

Additionally, when accessing recorded data from the disk, associated 8-to-16 demodulation and de-interleaving processes (refer to FIG. 3) is performed for reproducing the recorded data. When reproducing the data to thereby reproduce the original ECC block 30 while performing the effective error correction to accurately reproduce the data.

As the description above, error detection code EDC is a 4-byte check code attached to the previous 2060 bytes (including 12-byte sector data information and 2048-byte main data) for checking error of the sector data information and the main data. Considering the data sector as a single bit field starting with the most significant bit ("MSB" as for short) of the first byte of the ID field and ending with the last significant bit ("LSB" as for short) of the last EDC field, thus the MSB will be $b_{16511}$ and the LSB will be $b_0$. Each $b_i$ of the EDC is given as following:

$$EDC(x) = \sum_{i=31}^{0} b_i x^i = I(x) \bmod \{g(x)\} \quad \text{Equation (1)}$$

where $$I(x) = \sum_{i=32}^{16511} b_i x^i$$

$$g(x) = x^{32} + x^{31} + x^4 + 1$$

FIG. 4 is a flowchart showing a conventional method for generating EDC for a data sector. First, 2048-byte main data is delivered from the host through the interface and is written into DRAM (S1). Next, 2-byte ID Error Detection code (IED) is derived for achieving the purpose of correcting 4-byte ID information errors (S2). Thereafter, 6-byte reserve data (RSV) denoting copyright is then derived. (S3), while associated sector data information ID, IED, and RSV are respectively stored into DRAM (S4). Accordingly, ID, IED, RSV, and main data may be accessed from DRAM (S5) to calculate the 4-byte error detection code (EDC) (S6).

The EDC is, however, generated by calculating ID, IED, RSV, and the main data, which are 2060 bytes totally. Obviously, DRAM bandwidth is inefficient used since an excessive amount of data is transmitted between the optical drive IC and the memory buffer (DRAM).

Therefore, the recording speed of the optical disc using conventional error detection encoding is limited by the bandwidth of the memory buffer.

SUMMARY OF THE INVENTION

The present invention provides a method of generating error detection codes for a recording data comprising the steps as follows. In the embodiment, a first error detection code is firstly derived by using 12 bytes unknown sector data information including ID, IED, RSV and the 2048 bytes main data while receiving main data from a host. Here, the first error detection code is preliminary generated, denoted PEDC hereinafter. Secondly, a second error detection code is obtained by using known 12 bytes sector data information including ID, IED, and RSV and the 2048 bytes main data. Here, the second error detection code is generated according to the known main data, denoted MEDC hereinafter. Thereafter, a logical operation of PEDC and MEDC is performed to obtain the error detection code EDC.

In the embodiment, the logical operation is exclusive-OR operation

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

A previously application entitled "Optical Recording Method" and filed on 2004 Feb. 19 that has the same Applicant with the present invention discloses a method for generating parity codes with less memory accessing operations. In this previous application, a vertically scrambling is provided to generate PO before generating PI. As a result, total memory access operations used for generating required ECC could be reduced (3 times) and the memory bandwidth is also efficiently employed than the prior art. The present invention provides a method accompanied with the previously application for generating error detection codes before generating parity codes.

Figure 1:
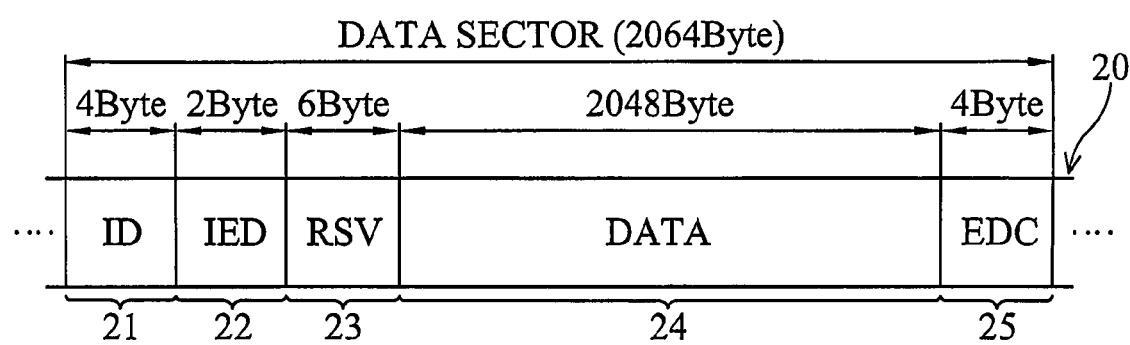
FIG. 1 shows a data structure of recorded data.
Figure 2:
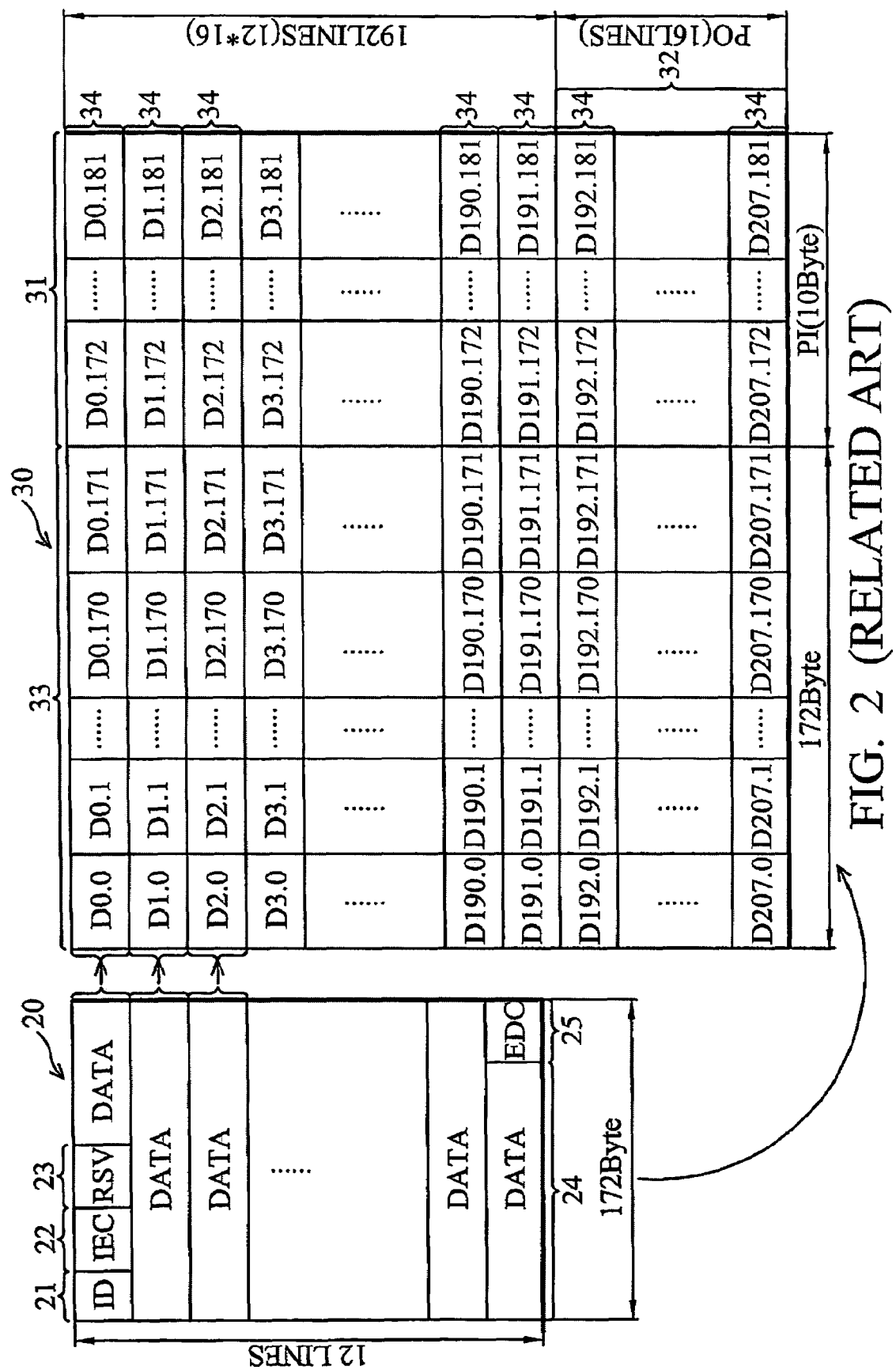
FIG. 2 shows a configuration of an ECC block in the recorded data.
Figure 3:
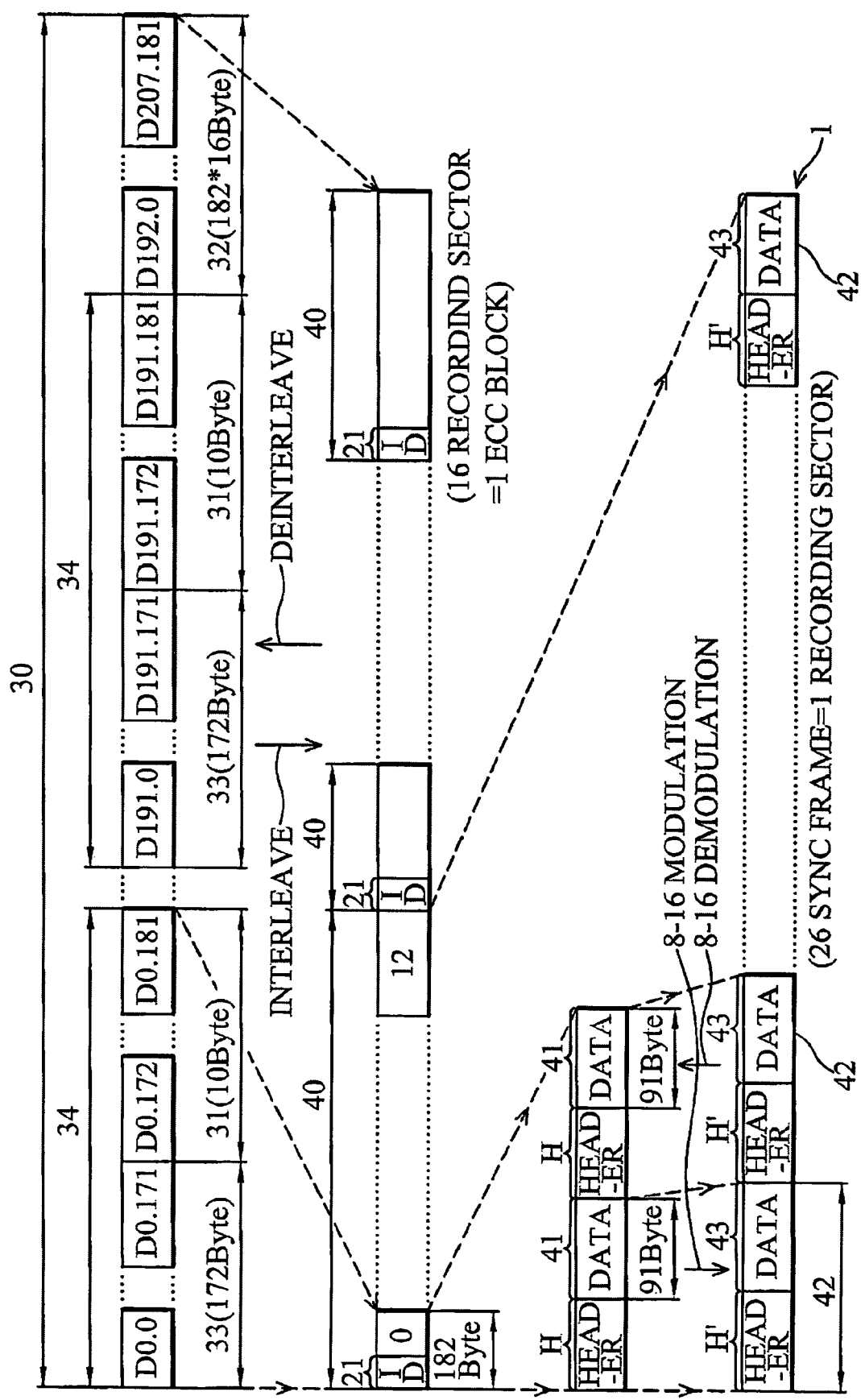
FIG. 3 shows a physical format of recorded data.
Figure 4:
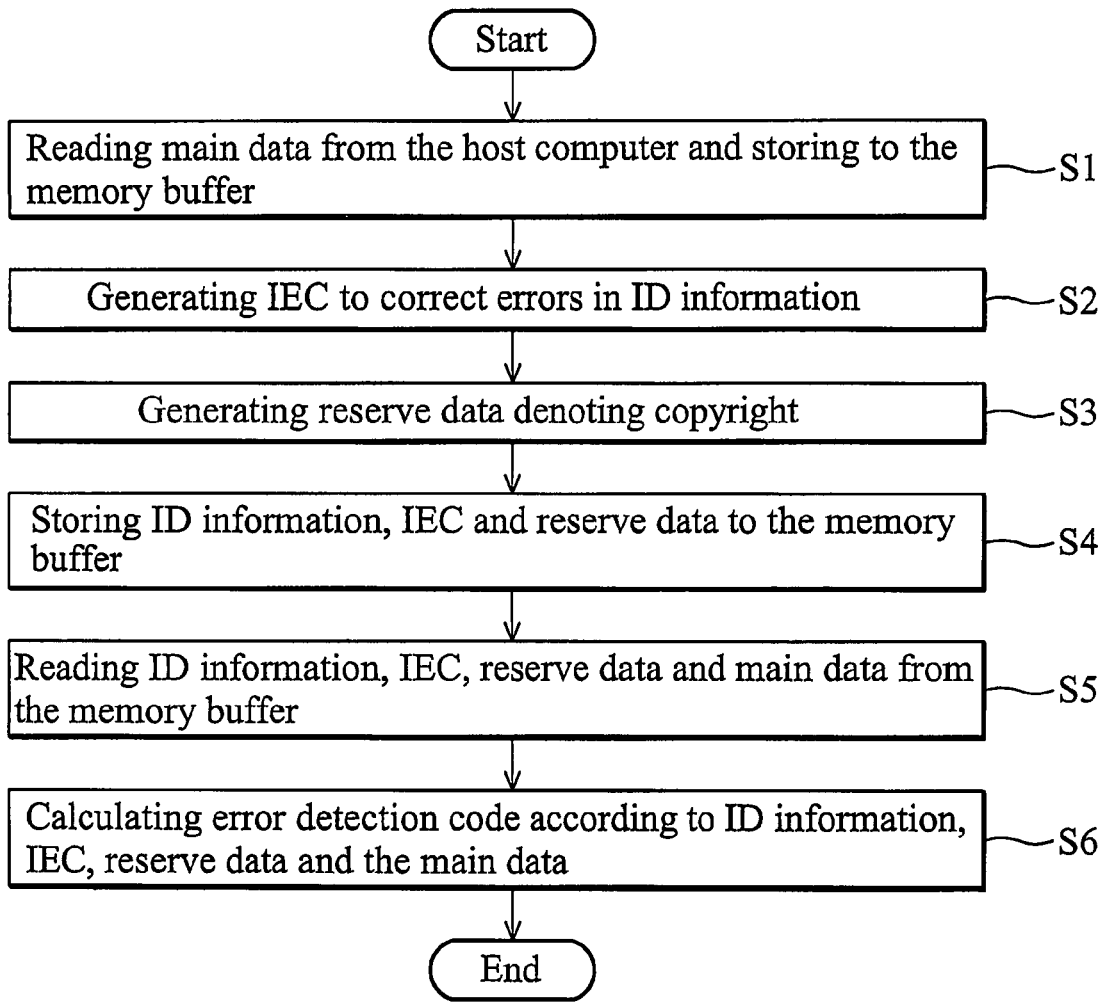
FIG. 4 is a flowchart showing a conventional method for generating error detection codes for a DVD.
Figure 5:
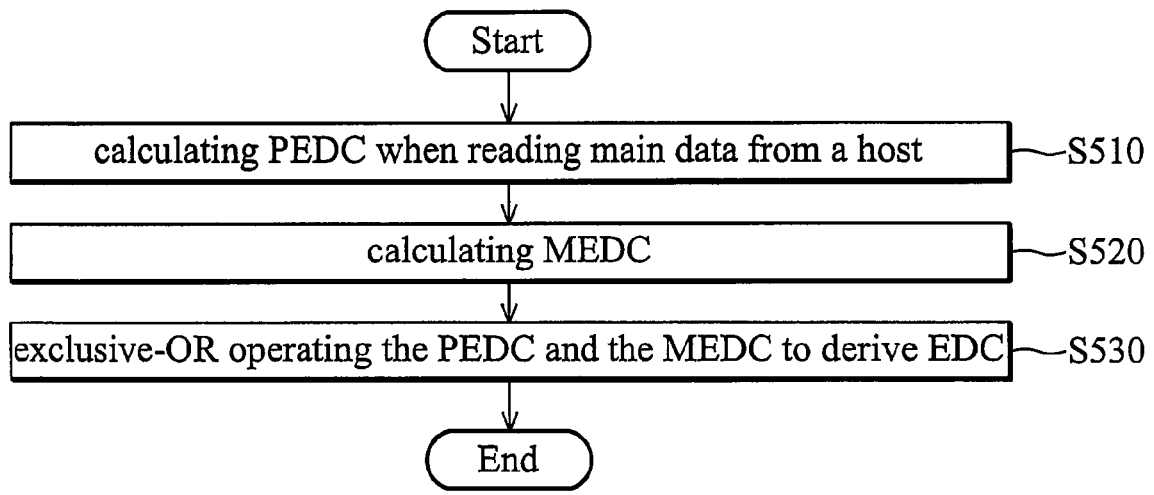
FIG. 5 is a flowchart showing the method of generating error detection codes according to the embodiment of the present invention.

FIG. 5 is a flowchart showing the method of generating error detection codes according to the embodiment of the present invention. Firstly, when main data is transferred from a host, a first error detection code PEDC is figured out by applying the 12 bytes unknown sector data information including ID, IED, RSV and the 2048 bytes main data via Equation (1) (S510). Please note that while the main data is transferred from the host, the 12-byte sector data informationis unknown, thus the 12-byte unknown sector data information is regarded as zero, i.e. those bytes $b_{16511} \sim b_{16416}$ are taken as zero in block S510. After the main data being written into a data sector of an ECC block, a second error detection code MEDC is obtained by applying the known 12-byte sector data information including ID, IED, RSV and the 2048 bytes main data via Equation (1) (S520). Please note that when writing the main data into the desired data sector, the sector data information is derived and the main data could be regarded as zero, i.e. those bytes $b_{16415} \sim b_{32}$ are taken as zero in block S520. Finally, by applying an exclusive-OR operation of PEDC and MEDC, the error detection code EDC (S530) may be obtained and written into the data sector in DRAM. The equation is introduced as:

$$\text{EDC} = \text{PEDC} \oplus \text{MEDC}; \quad \text{Equation (2)}$$

where $\oplus$ stands for the exclusive-OR operation.

As the descriptions above, it is observed that required memory accessing operations are significantly less than before because the first error detection code PEDC is obtained simultaneously when the main data is delivered from the host. Furthermore, only 12-byte sector data information needed to be accessed when calculating the second error detection code MEDC, which also indicates that the memory bandwidth of accessing 2048-byte main data is saved.

Furthermore., as the descriptions above, the 12-byte sector data information used for calculating the first error detection code PEDC and the 2048 bytes main data used for calculating the second error detection code MEDC, are respectively regarded as zero and substitution into Equation (1), but the numeric value is not limited to zero, any other certain values could also be substitutions, also the substitution numeric value not limited to the same numeric values. As a result, the Equation (2) could be corrected as:

$$\text{EDC} = \text{PEDC} \oplus \text{MEDC} \oplus C; \quad \text{Equation (3)}$$

where C stands for a correction constant. For example, if the substitution numeric value is "1", thus the correction constant C is a expectable constant that could derive the same result which substituting by "0" after exclusive-OR operation.

In the present invention, it is noticed that the main data is substituted by substitution numeric value sequentially, which indicates that the totally calculating time still remains the same. For example, assume that the calculating time of one byte is 1T, the total calculating time for generating the second error detection code MEDC is 2060T in the conventional approach, which includes the calculating time used for the 12 bytes sector data information, and the 2048 bytes preset main data "0".

As a result, another way for calculating the second error detection code MEDC is introduced by providing a formula to reduce calculating time. By using the formula when calculating the second EDC (i.e. MEDC), the following 2048 bytes main data could be directly skipped after applying the 12 bytes sector data information into Equation (1). Still assume that the calculating time of a byte is 1T, thus the total calculating time for generating second detection code MEDC is 13T in the disclosed method, in which 12T is required for the 12 bytes sector data information and the extra 1T is required for processing the formula to skip the following 2048 bytes main data. Therefore, the calculating time for generating the second error detection code MEDC is mostly reduced.

By contrast, the conventional method for generating the error detection code is calculating ID, IED, RSV, and the main data. Thus, excessive data transmissions occur between the IC chip and the memory buffer (DRAM), which significantly wastes valuable DRAM bandwidth. However, a first error detection code is firstly generated according to the 12 bytes substitution sector data information (i.e. for example "0") and the 2048 bytes main data in the present invention when reading the main data from the host. The second error detection code is then generated according to the 12-byte sector data information and the 2048-byte substitution main data (i.e. for example "0"). Thereafter a logic operation (i.e. the exclusive-OR operation) is performed to generate the error detection code EDC the same as that derived by the conventional method.

The advantage of the method for generating the error detection code is that the data transmissions between the IC chip and the data buffer is significantly reduced than before. According to the present invention, the first error detection code PEDC is generated without knowing the sector data information while the main data is just received from the host pipe. Additionally, the second error detection code MEDC is generated without accessing the main data. Moreover, the error detection code EDC is generated by using the 4-byte first error correction code PEDC and the 4-byte second error correction code MEDC without accessing the entire 2060 bytes sector data information and main data again.

Furthermore, for some cases that the same main data is repeatedly used to write into different data sectors (but with different sector data information), the first error detection code PEDC should be all the same due to the same main data. Therefore, the error detection code EDC of each data sector including the identical main data could be obtained by operating on the same first error detection code PEDC, while the corresponding second error detection code MEDC may be generated according to respective sector data information and the same substitution main data. Accordingly, the performance of generating the error detection codes for those data sectors having the identical main data is significantly increased than before.

The foregoing description of the invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for generating an error detection code of a data sector with sector data information and main data comprising:

generating a first error detection code according to the sector data information and the main data, wherein the sector data information is substituted by a first substitutional value;

generating a second error detection code according to the sector data information and the main data, wherein the main data is substituted by a second substitutional value; and generating the error detection code by operating on the first error detection code, the second detection code and a correction constant, wherein the correction constant is derived depending on the first substitutional value and the second substitutional value;

wherein the first error detection code is generated when the main data is read from a host.

2. The method as claimed in claim 1, wherein the error detection code is generated by performing exclusive-OR operation of the first error detection code, the second error detection code and the correction constant.

3. The method as claimed in claim 1, wherein the correction constant is not taken into consideration when the first substitutional value and the second substitutional value are both substituted by zero.

4. The method as claimed in claim 1, wherein the sector data information comprises identification data (ID), ID error correction code (IED), and reserve data (RSV).

5. A method for generating an error detection code of a data sector with sector data information and main data comprising:

generating a first error detection code according to the sector data information and the main data, wherein the sector data information is substituted by a first substitutional value;

generating a second error detection code according to the sector data information; and generating the error detection code by on operating the first error detection code, the second error detection code and a correction constant, wherein the correction constant is derived depending on the first substitutional value;

wherein when generating the second error detection code, the main data is substituted by 0.

6. The method as claimed in claim 5, wherein the first error detection code is generated when the main data is reading from a host.

7. The method as claimed in claim 5, wherein the error detection code is generated by performing exclusive-OR operation of the first error detection code, the second error detection code and the correction constant.

8. The method as claimed in claim 5, wherein when generating the second error detection code, a formula is provided for skip considering the main data.

9. The method as claimed in claim 5, wherein when the first substitutional value is substituted by zero, the correction constant is not taken into consideration.

10. The method as claimed in claim 5, wherein the sector data information comprises identification data (ID), ID error correction code (IED), and reserve data (RSV).

11. A method for generating a plurality of error detection codes of a plurality of data sectors with a plurality of different sector data information and same main data comprising:
  generating a first error detection code according to the same main data, wherein each different sector data information are respectively substituted by a corresponding first substitutional value;
  generating a plurality of second error detection codes according to each corresponding different sector data information; and
  generating the plurality of error detection codes by operating on the first error detection code, the corresponding plurality of the second error detection codes, and a correction constant;
  wherein the first error detection code is generated when the same main data is read form a host.

12. The method as claimed in claim 11, wherein the plurality of error detection codes are generated by performing exclusive-OR operation of the first error detection code, the plurality of second error detection codes, and the correction constant.

13. The method as claimed in claim 11, wherein when the plurality of second error detection codes are generated only according to each different sector data information by providing a formula to skip considering the following main data.

14. The method as claimed in claim 11, wherein when the second error detection code is generated according to both the corresponding sector data information and the same main data, the same main data is substituted by a second substitutional value.

15. The method as claimed in claim 14, wherein the correction constant is derived depending on the first substitutional value and the second substitutional value.

16. The method as claimed in claim 15, wherein when the corresponding first substitutional value and the second substitutional value are both substituted by zero, the correction constant is not taken into consideration.

17. The method as claimed in claim 11, wherein the sector data information comprises identification data (ID), ID error correction code (IED), and reserve data (RSV).

\* \* \* \* \*

UNITED STATES PATENT AND TRADEMARK OFFICE
CERTIFICATE OF CORRECTION

| | | |
|---|---|---|
| PATENT NO. | : 7,426,682 B2 | Page 1 of 1 |
| APPLICATION NO. | : 10/797007 | |
| DATED | : September 16, 2008 | |
| INVENTOR(S) | : Peng et al. | |

It is certified that error appears in the above-identified patent and that said Letters Patent is hereby corrected as shown below:

In column 2, line 49, delete "a" and insert -- an --, therefor.

In column 3, line 26, delete "derived. (S3)," and insert -- derived (S3), --, therefor.

In column 3, line 56, delete "is exclusive–OR operation," and insert -- is an exclusive–OR operation. --, therefor.

In column 4, line 30-31, delete "informationis" and insert -- information is --, therefor.

In column 4, line 57, delete "Furthermore.," and insert -- Furthermore, --, therefor.

In column 5, line 3, delete "a" and insert -- an --, therefor.

Signed and Sealed this

Ninth Day of February, 2010

David J. Kappos
*Director of the United States Patent and Trademark Office*